(12) United States Patent
Leussler et al.

(10) Patent No.: US 10,481,226 B2
(45) Date of Patent: Nov. 19, 2019

(54) GENERATION OF RF SIGNALS FOR EXCITATION OF NUCLEI IN MAGNETIC RESONANCE SYSTEMS

(71) Applicant: KONINKLIJKE PHILIPS N.V., Eindhoven (NL)

(72) Inventors: Christoph Leussler, Eindhoven (NL); Peter Vernickel, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 99 days.

(21) Appl. No.: 15/753,432

(22) PCT Filed: Aug. 19, 2016

(86) PCT No.: PCT/EP2016/069665
§ 371 (c)(1),
(2) Date: Feb. 19, 2018

(87) PCT Pub. No.: WO2017/032696
PCT Pub. Date: Mar. 2, 2017

(65) Prior Publication Data
US 2018/0238975 A1    Aug. 23, 2018

(30) Foreign Application Priority Data

Aug. 21, 2015 (EP) .................................... 15181933

(51) Int. Cl.
*G01V 3/00* (2006.01)
*G01R 33/36* (2006.01)
*G01R 33/38* (2006.01)

(52) U.S. Cl.
CPC ..... *G01R 33/3607* (2013.01); *G01R 33/3614* (2013.01); *G01R 33/3804* (2013.01)

(58) Field of Classification Search
CPC .............. G01R 33/543; G01R 33/5608; G01R 33/385; G01R 33/4828; A61B 5/055
USPC ........................................................... 324/309
See application file for complete search history.

(56) References Cited

U.S. PATENT DOCUMENTS

| | | |
|---|---|---|
| 2005/0046476 A1 | 3/2005 | Albrecht et al. |
| 2007/0142000 A1* | 6/2007 | Herzinger ................ H04B 1/04 455/91 |
| 2007/0210863 A1 | 9/2007 | Schnell |
| 2009/0256571 A1 | 10/2009 | Griswold et al. |

(Continued)

OTHER PUBLICATIONS

M. Di Giacomo, "Solid State RF Amplifiers for Accelerator Applications", in2p3-00382152, version 1-7 May 2009, "Particle Accelerator Conference (PAC09), Vancouver : Canada (2009)".

(Continued)

*Primary Examiner* — Walter L Lindsay, Jr.

(57) ABSTRACT

The invention provides for a system (200) for generation of a radio frequency, RF, excitation signal for excitation of nuclei via an RF excitation coil (114) in a magnetic resonance system (100). The system comprises power generation units (203-206) each comprising a synthesizer (211-214), an RF amplifier (231-234), and a first feedback loop (251-254) unit adapted to configure the synthesizer to generate an RF signal which after amplification by the RF amplifier has a predefined first signal characteristic and a combiner (261) adapted for combining the RF signals amplified by the RF amplifiers for obtaining the RF excitation signal.

15 Claims, 4 Drawing Sheets

(56) References Cited

U.S. PATENT DOCUMENTS

| | | |
|---|---|---|
| 2010/0141257 A1* | 6/2010 | Graesslin .......... G01R 33/3607 |
| | | 324/314 |
| 2010/0148874 A1 | 6/2010 | Thuringer et al. |
| 2012/0268129 A1 | 10/2012 | Vester |
| 2012/0281737 A1 | 11/2012 | Hung et al. |
| 2013/0063208 A1 | 3/2013 | Acimovic |
| 2013/0342207 A1 | 12/2013 | Keupp et al. |
| 2014/0198880 A1 | 7/2014 | Borodulin et al. |

OTHER PUBLICATIONS

U. Gysel, 'A new N-way power divider/combiner suitable for high power applications; in 1975 MTT Symp. Dig., pp. 116-118.
Jain et al "Compact Solid Stte Radio Frequency Amplifiers in KW Regime for Particle Accelerator Subsystems", Sadhana vol. 38, Part 4, Aug. 2013 p. 667-678.

* cited by examiner

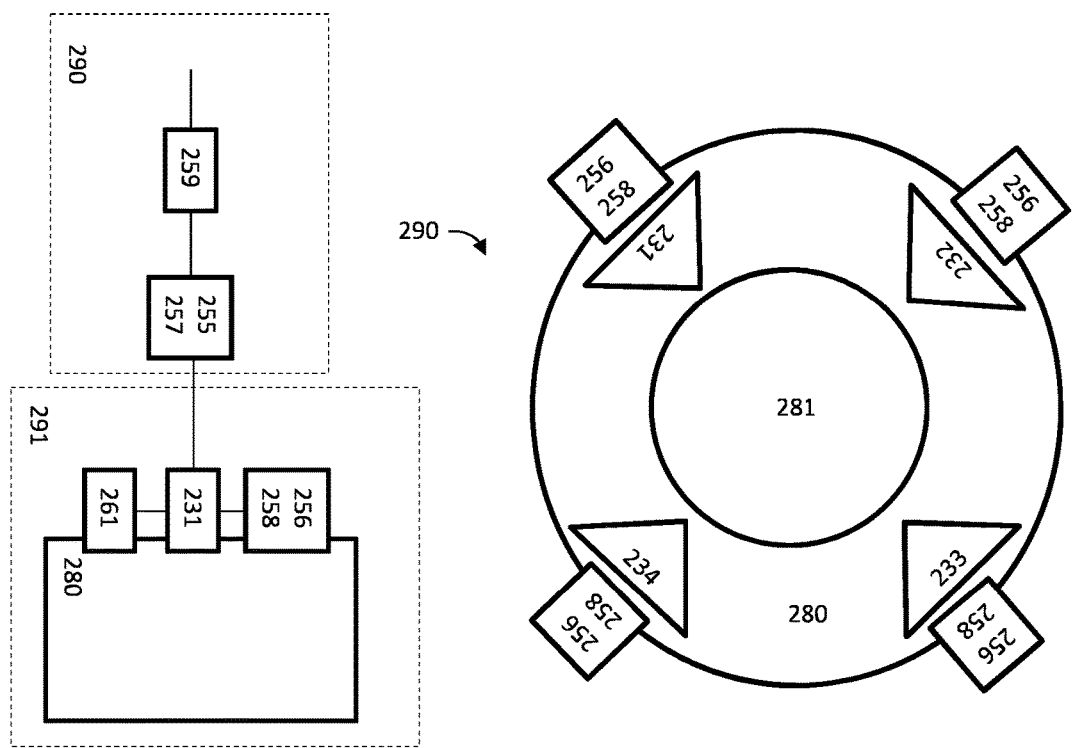
Fig. 5
Fig. 6
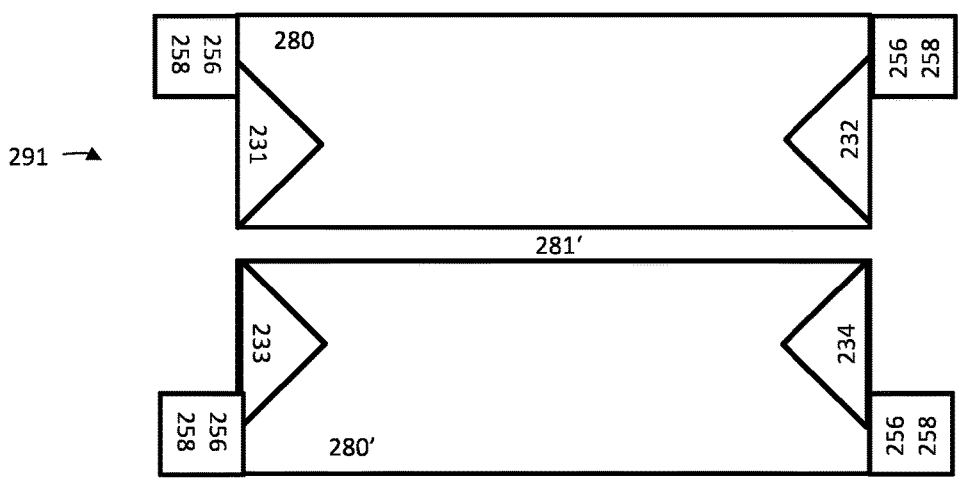
Fig. 7

GENERATION OF RF SIGNALS FOR EXCITATION OF NUCLEI IN MAGNETIC RESONANCE SYSTEMS

CROSS REFERENCE TO RELATED APPLICATIONS

This application is a U.S. national phase application of International Application No. PCT/EP2016/069665, filed on Aug. 19, 2016, which claims the benefit of EP Application Serial No. 15181933.1 filed on Aug. 21, 2015 and is incorporated herein by reference.

TECHNICAL FIELD

The invention relates to generation of radio frequency (RF) signals, in particular to the generation of the RF excitation signals in magnetic resonance systems.

BACKGROUND OF THE INVENTION

A large static magnetic field being further referred as BO field is used by various Magnetic Resonance (MR) system systems to align the nuclear spins of atoms as part of the procedure for acquiring magnetic resonance data. For instance, the BO field generated in a magnetic resonance imaging (MRI) system is used to align the nuclear spins of atoms in a body of a patient as a part of the procedure for obtaining images of the body of a patient. The BO filed generated in a nuclear magnetic resonance (NMR) spectrometer is used to align nuclear spins of atoms in a material as part of a procedure for exploring a structure of the material, positioning and/or reaction state of the atoms in a lattice or molecules of the material, etc.

Another essential unit for acquisition of the MR data is an RF transmitter of an RF excitation signal coupled to one or more transmitter coils. The RF excitation signals generated by the transmitter excite the one or more transmitter coils, which in their turn cause perturbations to the local magnetic field. The perturbations of the local magnetic field cause excitation of the nuclear spins. Relaxation of the excited nuclear spins results in emission of an RF signal received by the one or more transmitter coils and/or one or more receiver coils. These received RF signal is used to reconstruct MR data (e.g. MR images). The RF excitation signals, especially in the MRI, can have high power (e.g. 10 kW for a duration of a few milliseconds (ms)) and/or comprise a series of RF pulses having various amplitudes and/or shapes (e.g. binomial RF pulse sequences enabling selective excitation of different compounds in a body of a patient).

The aforementioned modules are one of the most critical elements of almost any magnetic resonance system. Improvement in stability of their performance and/or compact implementation is an everlasting problem of development of these systems. The US patent application US2005/0046476 discloses a generation device for generating a magnetic resonance excitation signal.

SUMMARY OF THE INVENTION

The invention provides for a system for generation of an RF excitation signal for excitation of nuclei via an RF excitation coil in an MR system, a method, and a computer program product in the independent claims. The invention further provides for an MRI system equipped with the system for the RF excitation signal in the further independent claim. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, webcam, headset, wired glove, remote control, and accelerometer are all examples of user interface components which enable the receiving of information or data from an operator. A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a magnetic resonance apparatus during an acquisition of an MR data (e.g. an MR imaging scan). Magnetic resonance data is an example of medical image data. A Magnetic Resonance (MR) image is defined herein as being the reconstructed two or three dimensional visualization of anatomic data contained within the magnetic resonance data. This visualization can be performed using a computer.

A main magnet assembly of an MR system, as defined herein, encompasses the main magnet generating BO field and a cooling system of the main magnet. In a case when the MR system is a MRI system, then the main magnet assembly further comprises one or more gradient coils.

In one aspect the invention provides for a system for generation of an RF excitation signal for excitation of nuclei via an RF excitation coil in a MR system. The system comprises: power generation units each comprising a synthesizer, an RF amplifier, and a first feedback loop unit adapted to configure the synthesizer to generate an RF signal which after amplification by the RF amplifier has a predefined first signal characteristic and a combiner adapted for combining the RF signals amplified by the RF amplifiers for obtaining the RF excitation signal.

The system described in the previous paragraph may have a number of advantages. First of all it may enable an advanced heat dissipation management. It is a lot easier to engineer heat dissipation of several power generation units in comparison to developing a heatsink for a single power generation unit generating the same power as several power generation units. When several power generation units are employed, the heat sources are distributed. As a result thereof the heat management is less demanding. Another advantages feature of using several power generation units connected in parallel for the generation of the RF excitation signal may be a possibility to generate more complicated RF signals in comparison with the case when the single power generation unit is used. The latter advantage is discussed further below in greater details.

In another embodiment the system further comprises: a memory storing machine-executable instructions and a processor for controlling the system. Execution of the machine-executable instructions by the processor causes the system to: receive a request to generate the specified RF excitation signal, split the specified RF excitation signal into signal components of the RF signal, determine, for each of the power generation units, the respective predefined first signal characteristic representing one of the signal components, and generate the specified RF signal using the first signal characteristics.

The advantage of splitting the specified RF excitation signal between different power generation units may be a simple implementation of generation of complex RF pulses which generation by a single power generation unit constitutes a serious engineering challenge. In this case each of components of one complex RF pulse of the RF excitation signal can be generated by the respective power generation unit. The resulting complex RF pulse is generated at an output terminal of the combiner configured to concatenate the components of the complex RF pulse generated by the respective power generation units. Another advantage of splitting the RF excitation signal between the power generation units may be a possibility to implement an advanced heat dissipation management. For instance, when 2 power generation units are used for the generation of a sequence of RF pulses of the RF excitation signal, one of the power generation units can be configured to generate odd pulses of the RF excitation signal and another one of the power generation units is configured to generate even pulses of the RF excitation signal. As a result thereof each of the power generation units has longer time for cooling in comparison with a situation when a single power generation unit is used for the generation of the RF excitation signal.

In another embodiment one of the signal components has higher peak amplitude than the other signal components.

This embodiment may enable selective splitting of the signal components according to the amplitude discriminative preselection. Configuration of one of the power generation units can be optimized for the generation of the RF pulses with low amplitude, while configuration of another one of the power generation units can be optimized for the generation of the RF pulses with high amplitude. As a result thereof the resulting generated RF excitation signal is generated with better fidelity in compassion with a situation when all RF pulses are generated by a single power generation unit.

In another embodiment one of the signal components is allocated in a different time-frequency domain as the other signal components.

This embodiment may enable another approach for splitting the RF excitation signal enabling adaptive configuration of the power generation units in accordance with signal characteristics of the respective signal components of the RF excitation signal. The advantages of this approach are similar to the advantages of the embodiment mentioned above.

In another embodiment the MR system is a magnetic resonance imaging system. The specified RF excitation signal comprises composite RF signal. At least one of RF pulses of the composite RF signal is constructed out of fragments of the different signal components.

This embodiment may enable yet another approach for splitting the RF excitation signal enabling adaptive configuration of the power generation units in accordance with signal characteristics of the respective signal components of the RF excitation signal. The advantages of this approach are similar to the advantages of the embodiments mentioned above.

In another embodiment the system further comprises a second feedback loop unit adapted to control the synthesizers for providing the RF signals such that the RF excitation signal has a predefined second signal characteristic. The execution of the machine-executable instructions by the processor causes the system to determine the predefined second signal characteristic to obtain the specified RF excitation signal.

This embodiment may enable for a better fidelity of the generated RF excitation signal. For instance, the second feedback loop can enable better time and/or phase synchronization of the signal components generated by the power generation units enabling correct concatenation of the signal components by the combiner.

The present invention concerns a system for generating a radio frequency (RF) signal. This system is a multichannel system having an RF power amplifier in each channel, each with its own synthesiser and first (local) feedback loop. In each channel the synthesiser is configured (adjusted) in dependence of a comparison of a detected RF signal property at the channel's output to a target RF signal property. This first (local) feedback loop controls the RF signal at the RF amplifier output in each channel. A second (global) feedback loop is provided which compares a registered RF signal characteristic at the combiner's output (i.e. an RF signal characteristic of the combined RF signal) and controls the synthesisers (in each of the channels) on the basis of the comparison of the RF signal characteristic (of the combined signal).

This invention achieves to control the (MOSFET) RF amplifier in each channel to account for differences in signal properties (linearity, gain, phase stability) in each channel. Optionally, there may be a local feedback loop for correcting for deviations due to a local pre-amplifier in each of the channels and another local feedback loop which may compensate for distortions in a pre-amplifier in each channel. The second (global) feedback loop is provided to control the synthesisers in each channel on the basis of a comparison of a registered signal characteristic of the combined signal. This global feedback loop can enable better timing and phase synchronisation and thus enable correct concatenation of the RF signals from the channels by the combiner. This global feedback loop in particular adjusts so that the combined signal cancel minimally. Further, the digital control of the combination of the feedback loops in individual channel in combination with the global feedback loop based on the combined signal is simpler to adjust.

In another embodiment each power generation unit further comprises: a power supply of the RF amplifier and a third feedback loop adapted to configure the power supply for supplying an electrical power to the RF amplifier with a predefined electrical power characteristic. The determining, for each of the power generation units, of the respective predefined first signal characteristic comprises determining, for each of the power generation units, the respective predefined electrical power characteristic ensuring that the RF signal after the amplification has the respective first signal characteristic.

This embodiment may enable for adaptation of the electrical power provided to the amplifiers enabling tuning of the properties of the amplifiers in accordance with signal characteristics of the signal components to be generated by the power generation units.

In another embodiment each RF amplifier comprises a field effect transistor (FET) configured for the amplification of the RF signal. The predefined electrical power characteristic comprises at least one of the following: voltage at a gate of the FET and current flowing through a channel of the FET.

This embodiment further allows specifying the electrical power characteristics used for tuning of the properties of the amplifiers. Selection of particular gate bias and drain current determines fundamental properties of the amplifier like linearity, gain, power efficiency, etc. In the other words the specified electrical power characteristics determine a class of the amplifier (A, B, AB, C, etc.).

In another embodiment, the power supplies are switched power supplies each comprising a capacitor bank and a ferrite choke both being galvanically connected to a drain of the respective FET. The capacitor banks are configured for incorporation into a main magnet assembly of the MR system. The ferrite chokes are configured for being positioned remotely from the main magnet assembly of the MR system.

This embodiment may provide for a compact incorporation of the components of the system for the generation of the RF excitation signal into the MR system.

In another embodiment the predetermined signal characteristics comprise at least one of the following: average power, peak power, phase, spectrum, intermodulation, amplitude, and pulse shape.

In another embodiment the RF amplifiers and/or combiner being adapted for being incorporated in a main magnet assembly of the MR system.

This embodiment may provide for a compact incorporation of the components of the system for the generation of the RF excitation signal into the MR system. The compact incorporation of the amplifiers and the combiner may, in its own turn, enable substantial reduction in a length of RF cables and as a result thereof generation of the RF excitation signal with better fidelity.

In another aspect the invention provides for a method for generating of an RF excitation signal for excitation of nuclei via an RF excitation coil in a MR system. The MR system comprises: power generation units each comprising an RF amplifier and a combiner adapted for combining the RF signals amplified by the RF amplifiers for obtaining the RF excitation signal. The method comprises: receiving a request to generate the specified RF excitation signal, splitting the specified RF excitation signal into signal components of the specified RF excitation signal, and determining, for each of power generation units of the system, a respective predefined first signal characteristic representing one of the signal components, each of the power generation units further comprising a synthesizer and a first feedback loop unit configuring the synthesizer to generate an RF signal which after amplification by the RF amplifier has the predefined first signal characteristic.

In another aspect the invention provides for a computer program product comprising machine-executable instructions for performing the aforementioned method.

In another aspect the invention provides for a MR system. The MR system comprises: a main magnet, one or more RF coils for excitation of nuclei in the MR system by an RF excitation signal, an RF transmitter for generation of the RF excitation signal used for excitation of the nuclei via the one or more RF coils. The, the RF transmitter comprises: power generation units each comprising a synthesizer, an RF amplifier and a first feedback loop unit adapted to configure the synthesizer to generate an RF signal which after amplification by the RF amplifier has a predefined first signal characteristic and a combiner adapted for combining the RF signals amplified by the RF amplifiers for obtaining the RF excitation signal. The MR system further comprises a memory storing machine-executable instructions and a processor for controlling the MR system. Execution of the machine-executable instructions by the processor causes the MR system to: receive a specification of the RF excitation signal, split the specified RF excitation signal into signal components of the specified RF excitation signal, determine, for each of the power generation units, the respective predefined first signal characteristic representing one of the signal components, and generate by the RF transmitter the specified RF signal using the determined predefined first signal characteristics.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 5 illustrates an allocation layout of components of an RF generator with respect to a main magnet assembly;

FIG. 6 illustrates an allocation layout of components of an RF generator with respect to a main magnet assembly; and FIG. 7 illustrates an allocation layout of components of an RF generator with respect to a main magnet assembly.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
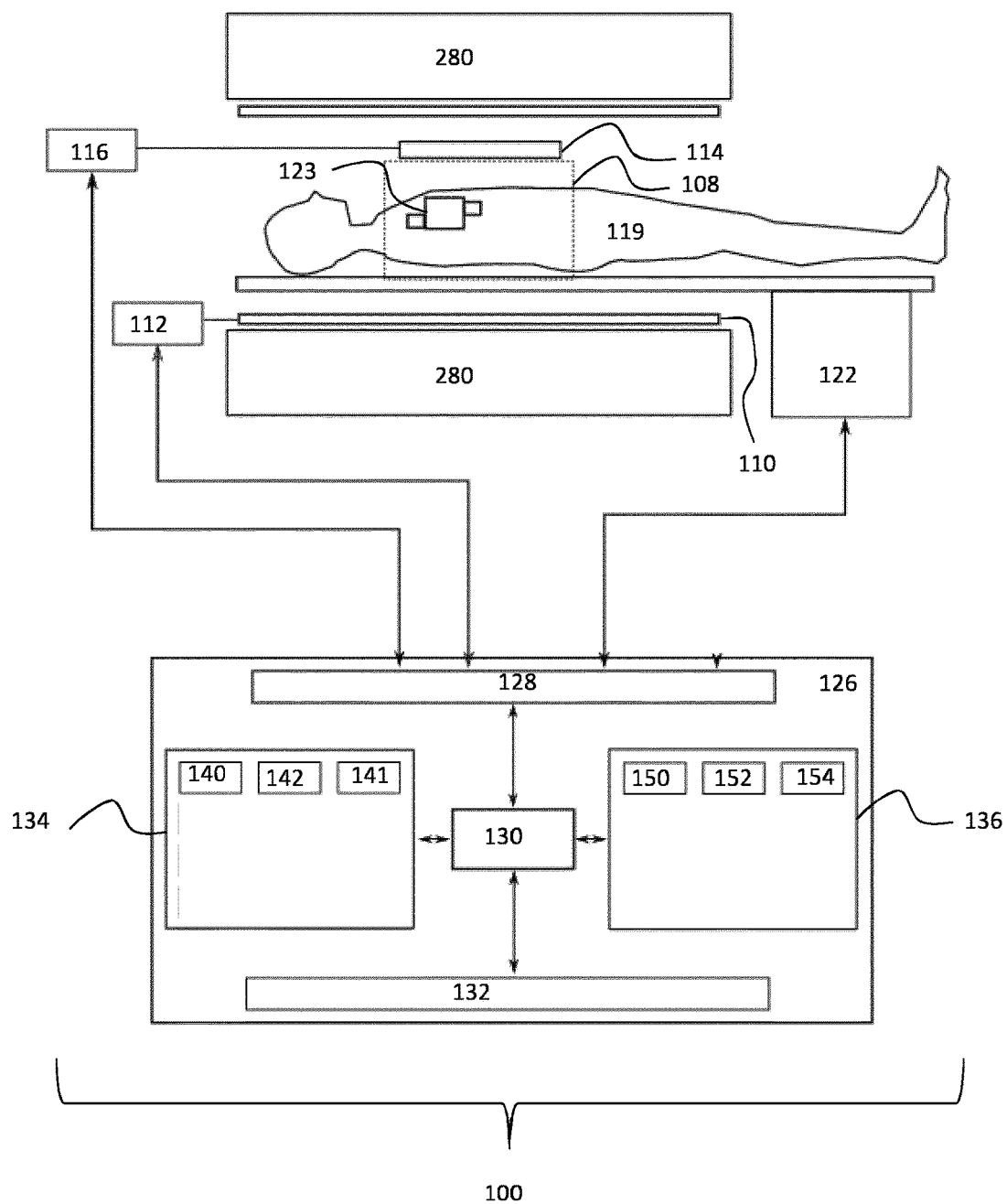
FIG. 1 illustrates an example of a magnetic resonance imaging system.

FIG. 1 shows an example of a magnetic resonance imaging system 100 with a magnet 104. The magnet 104 is a superconducting cylindrical type magnet 104 with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientation of magnetic spins within the imaging zone 108 and for receiving radio transmissions from spins within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate RF transmitter 200 and receiver. The radio-frequency coil 114 may also have multiple receive/transmit elements and the radio frequency transceiver 116 may have multiple receive/transmit channels.

Within the bore 106 of the magnet 104 there is a subject support 120 which is attached to an optional actuator 122 that is able to move the subject support and the subject 118 through the imaging zone 108. Within the imaging zone 108 there is a region of interest 123.

The transceiver 116, the magnetic field gradient coil power supply 112 and the actuator 122 are all seen as being connected to a hardware interface 128 of computer system 126.

Figure 2:
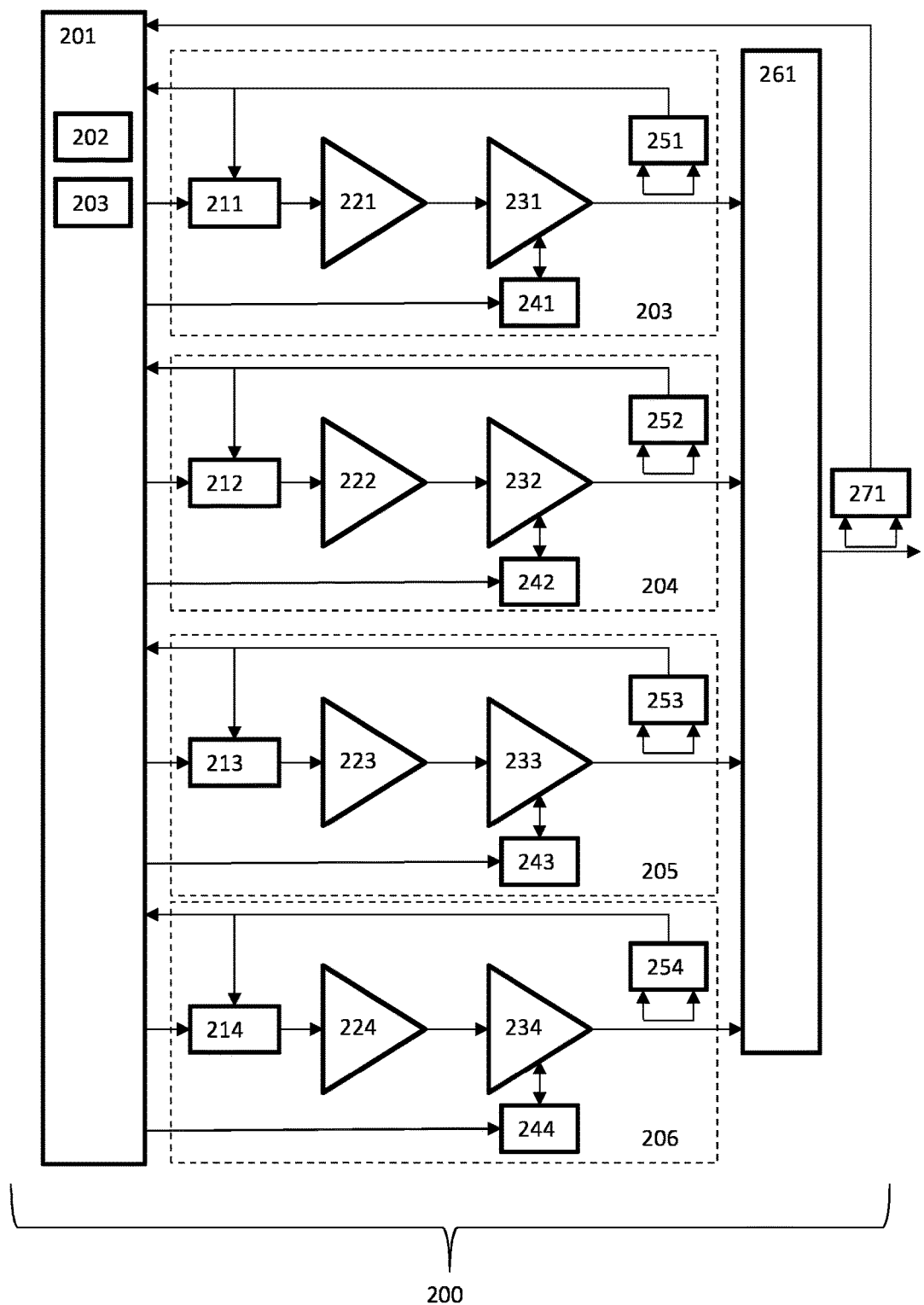
FIG. 2 illustrates a block scheme of an RF generator.

The transmitter of transceiver 116 comprises power generation units 203-206 which RF power outputs are coupled via a combiner 261 to the transmit coils or to the transmit and receive coils (FIGS. 1 and 2). The power generation units can be directly connected to the hardware interface 128 and directly operated by the processor 130. The transmitter 200 can further comprise a controller 201 connected to the hardware interface 128. In this case the power generation units are operated by the controller controlled by the processor 202 of the controller in accordance with the instructions received from the processor 130 via the hardware interface 128.

The computer storage 134 is shown as containing MRI scan programs 140. The can programs 140 comprise descriptions of corresponding regions of interest 123 being scanned in a subject 119, when the MRI system executes the scan program, description of images acquired in the regions of interest, and a set of system parameters required for the execution of the scan program. The set of system parameters comprises descriptions of pulse sequence commands which execution is required for acquisition of the images specified in the scan programs. The pulse sequence commands cause the transmitter to generate an RF excitation signal required for the execution of the respective scan. The pulse sequence commands 140 further cause the magnetic resonance imaging system 100 to perform a readout of the magnetic resonance data 141 for the region of interest.

The computer storage 134 is further shown as containing magnetic resonance data 141 that was acquired by controlling the magnetic resonance imaging system 100 with the pulse sequence commands 140. The computer storage 134 is further shown as containing an image 142 that was reconstructed from the magnetic resonance data 141.

The computer memory 136 is shown as containing a control module 150. The control module 150 contains computer executable instructions that enable the processor 130 to control the operation and function of the magnetic resonance imaging system 100. For example the control module 150 may enable the processor 130 to perform MRI scans comprising usage or execution of the pulse sequence commands 140 to control the other portions of the magnetic resonance imaging system 100 to acquire the magnetic resonance data 141. The computer memory 136 is shown as containing an image reconstruction module 152 that enables the processor 130 to reconstruct the image 142 from the magnetic resonance data 141. The computer memory 136 further comprises a control module 154 enabling the processor 130 to translate the specifications of the RF excitation signal into a settings of the RF transmitter 200 and configure that latter in way that it generates the specified RF signal. Alternatively, the processor 202 controlling the transmitter 200 can configure the transmitter 200 to generate the specified RF excitation signal using the specifications of the RF signal received via the hardware interface of 128 at the RF transmitter controller 201 from the processor 130.

The MRI system is just one of many systems where the RF transmitter (generator) 200 can be employed. It can be used almost in any system used for acquisition of MR data. For instance, it can be used for excitation of nuclei in NMR spectrometers. The RF transmitter can be coupled to one or more excitation coils in the NMR system. Like in the MR system 100 depicted on FIG. 1, the RF transmitter 200 can be configured for the generation of the RF excitation signal.

FIG. 2 illustrates a block diagram of the RF transmitter 200. It has four power generation units 203-206. As it will be clearly seen from further description, the RF transmitter can comprise any number of the power generation units being greater than one and can have the same functionalities as the RF transmitter illustrated of the FIG. 2. The RF transmitter can comprise a controller 201 configured to control the RF power generating units. The controller 201 is optional, the power generating units can be directly controlled by the processor 130 of the computer system 126 via the digital interface 128. The RF power outputs of the RF power generating units are coupled via the combiner 261 to the RF output of the RF generator. The combiner 261 can be a Gysel combiner.

The power generation unit 203 comprises a synthesizer 211, an RF amplifier 231, and a first feedback loop 251 adapted to configure the synthesizer to generate an RF signal which after amplification by the RF amplifier has a predetermined first signal characteristic. The first signal characteristic and other signal characteristics further in the text can be at least one of the following: average power, peak power, phase, spectrum, intermodulation, amplitude, and pulse shape, etc. The first feedback loop can be implemented in various ways. For instance, it can comprise a sensor registering the RF signal properties and the output of the amplifier 231. The registered RF signal properties are compared with the target RF signal properties and the synthesizer is reconfigured accordingly in order to generate an RF signal, which after the amplification by the amplifier to 231 has the specified RF signal properties. The comparison of the registered RF signal properties with the target RF signal properties and/or reconfiguration of the synthesizer 211 can be executed by a processor controlling the synthesizer 211 or by the processor 202 controlling the controller 201 or by the processor 130 controlling the system 126.

The RF power generating unit 203 can further comprise a preamplifier 221. The preamplifier 221 is configured to perform amplification of the RF signal generated by the synthesizer 211 and provide it to the input of the amplifier 231. The RF power generating unit 203 can further comprise another feedback loop. This feedback loop can be configured to monitor the performance of the preamplifier 221 and configure the synthesizer 211 in order to compensate for distortions introduced by the preamplifier 221. The compensation for the distortions introduced by the preamplifier 221 can be performed by a modification of the RF signal generated by the synthesizer 211 in a way that the RF signal after the amplification by the preamplifier 221 does not have the distortions anymore. This feedback loop can be operated in the same way as the first feedback loop described above.

The RF power generating unit 203 further comprises a power supply unit 241 of the amplifier 231. The RF power generating unit 203 further comprises a third feedback loop for controlling the electrical power characteristic of the electrical power provided by the power supply unit 412 to the amplifier 231. The electrical power characteristic can determine performance parameters of the amplifier 231 such as linearity, power efficiency, gain, and/or class of operation (A, AB, B, C), etc.

Figure 3:
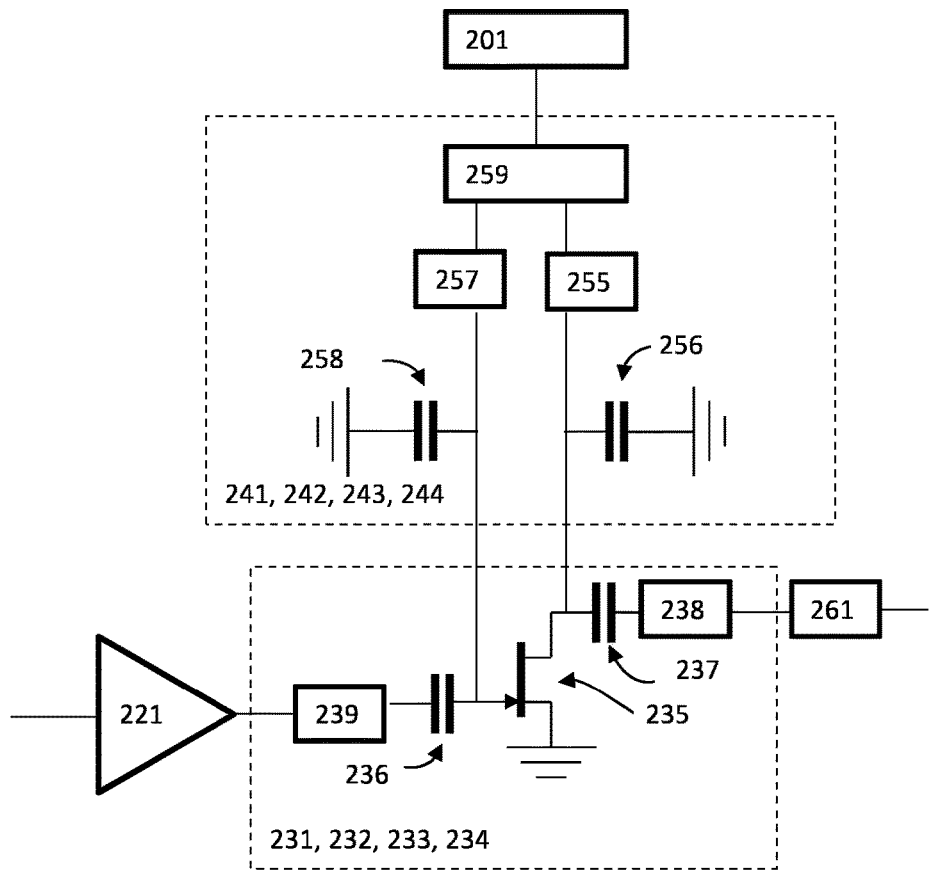
FIG. 3 illustrates a circuit diagram of an amplifier and a power supply.

The meaning of the electrical power characteristic and its influence on the performance of the amplifier 231 is illustrated on an example circuit diagram on FIG. 3. The circuit diagram illustrates an example electrical scheme of the amplifier 231. The amplifier 231 comprises a field effect transistor (FET) 235 configured to amplify the RF signal. The gate of the FET 235 is coupled via a blocking capacitor 236 and a RF matching unit 239 to an output of the preamplifier 221 (if the preamplifier is used in the RF power generating unit) or to an output of the synthesizer 211. The source of FET transistor 235 is grounded. The drain of the FET transistor 235 is coupled via a blocking capacitor 237 and a matching unit 238 to an input of a combiner 261. The power supply 241 can be as switched power supply providing a gate bias and a drain current of the FET 235. Selecting the proper electrical power characteristics such as the gate bias and the drain current can determine the required performance parameters of the amplifier 231 such as linearity, power efficiency, gain, and/or class of operation (A, AB, B, C, etc.), etc. The power supply 241 comprises a direct current (DC) power supply 259 providing the gate bias and of the drain current via the respective LC filters. The LC filter comprises a capacitor 258 (256) and an RF choke 257 (255). The RF choke can be an RF ferrite choke.

The other RF power generating units 204, 205, and 206 can be built in the same way as the RF power generating unit 203.

The RF transmitter 200 comprises a second feedback loop. It comprises a sensor 271 coupled to the output of the combiner 261. The sensor is configured to register RF signal characteristics of the RF signal at of the output of the combiner. The second feedback loop is configured to compare the registered signal characteristic with the target signal characteristic and reconfigure one or more synthesizers in a way that the registered signal characteristic matches the target signal characteristic.

The aforementioned feedback loops can be digital or analogue.

The transmitter 200 can comprise a memory 203 and a processor 202 controlling the transmitter 200. The memory 203 stores a machine-executable instructions, wherein execution of the machine-executable instructions by the processor causes the transmitter 200 to perform the following: receiving a request to generate the specified RF excitation signal; splitting the specified RF excitation signal into signal components of the RF signal; determining, for each of the first feedback loops (and third feedback loops), the respective predefined first signal characteristic representing one of the signal components (the respective predefined electrical power characteristic ensuring that the RF signal after the amplification has the respective first signal characteristic); determining, for the second feedback loop the second predetermined characteristic representing the specified RF excitation signal; and generating the specified RF signal using the first signal characteristics. The processor 202 and the memory 203 are optional. The aforementioned sequence of steps for the generation of the specified RF excitation signal can be performed by the transmitter 200 under the control of the processor 130 of the system 126.

This splitting of the specified RF excitation signal into the signal components of the RF signal enables generation of the RF excitation signals, which are impossible to generate using an RF transmitter comprising only one of the RF power generation units, or in the other words using an RF generator having only one amplification channel. Since of the RF excitation signal can comprise a sequence of RF pulses having substantially different amplitudes, spectrum, and/or power (e.g. composite RF excitation signal comprising binomial RF pulses) optimal amplification of these RF pulses by a single amplifier can require reconfiguration of the amplifier during the generation of the sequence of the RF pulses. The reconfiguration can comprise changing parameters like a gate bias and/or drain current. In the other words, the essential parameters of the RF amplifier such as linearity, gain, power efficiency, class of operation have to be changed on the fly. However, implementation of this functionality cannot guarantee optimal performance of the amplifier because even a single RF pulse can have a combination of power and spectrum, which is impossible to generate using a single amplifier even when a compensative pre-distortion of the source RF signal is used. Employing several RF power generation units operating in parallel and assigning to each of the power generation units a respective component of the RF excitation signal enables mitigation of the aforementioned problem of the generation of the complex RF pulses. The RF excitation signal can be split into the signal components having similar signal characteristics. For instance, RF pulses having amplitudes above a threshold value can be assigned to one of the signal components and the other RF pulses can be assigned to another one of the signal components. The splitting of the RF excitation signal can be done on a basis of Fourier analysis. Each of the signal components can be assigned to a respective area in a time-frequency domain. In this case, some of the RF pulses can be generated by at least two of the RF power generating units simultaneously. In the light of the aforementioned examples it is clear, that the splitting of the RF excitation signal in the signal components can be done in a way, that variation of the signal characteristics of the signal components is smaller than the variation of the signal characteristics of the parent RF excitation signal. Thus, it is possible to select the performance parameters for each of the RF power generation units enabling optimal amplification of the respective signal component.

Figure 4:
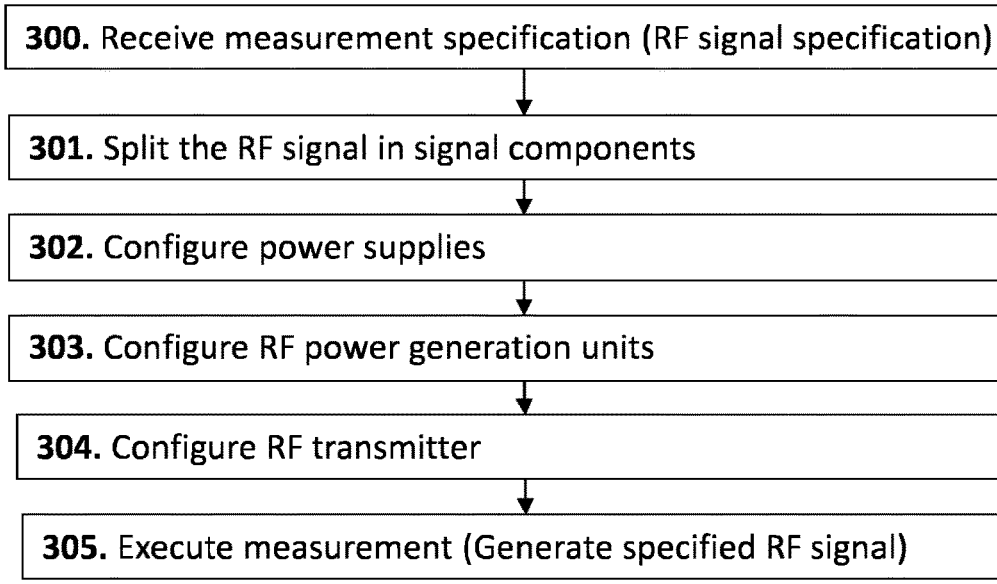
FIG. 4 shows a flow chart, which shows a method of generating an RF signal.

FIG. 4. illustrates a method of operating the magnetic resonance imaging system 100 of FIG. 1. Essentially the same steps are performed, when the RF transmitter is caused to generate a specified RF excitation signal. First in step 300 the magnetic resonance imaging system 100 receives an instruction to perform a scan program. This instruction can be received via a user interface 132, wherein a list of scan programs 140 is offered to a user via the user interface 132. The description of the scan program to be performed comprises a specification of the RF excitation signal. When the method illustrated on FIG. 4 is used for the generation of the RF excitation frequency than in step 300 the specification of the RF excitation signal is received.

Next in step 301 of the specified RF excitation signal is split as described above into the signal components. Afterwards in step 302 the power supplies are configured. This procedure comprises selection of the performance parameters for each of the amplifiers being optimal for the amplification of the respective signal component. The execution of step 302 results in determination of the predefined electrical power characteristics for each of the third feedback loops controlling the electrical power supplies 241-244.

Next in step 303 of the RF power generation units are configured. The configuration of each of the RF power generation units comprises determination of the respective predetermined first signal characteristic representing the respective signal component to be generated by said RF power generation unit. When the preamplifier I used in the RF power generation units then this procedure further comprises configuration of the feedback loops of the preamplifiers in order to minimize distortions of the RF signal caused by them. The configuration of each of the RF power generation units in step 303 can further comprise a correction of the predefined electrical power characteristics of the electrical power supplies in order to ensure that the RF signal at of the outputs of the amplifiers match the respective signal components.

Next in step 304 the RF transmitter is configured as a whole. The configuration of the RF transmitter comprises selecting a second predefined signal characteristic for the second feedback loop in order to ensure that of the RF signal generated by the RF transmitter matches the specified RF excitation signal. This can be done by configuring the second feedback loop to monitor the second predefined signal characteristic representing the specified RF excitation signal and to configure the synthesizers in a way that the RF signal generated by the RF transmitter has the second predefined signal characteristic. For instance, the second feedback loop can configure the synthesizers in a way that they generate the RF signals having phases enabling proper concatenation of the amplified RF signals by the combiner.

Next in step 305 the specified RF excitation signal is generated by the RF transmitter and accusation of the MRI image is performed.

Using multichannel 203-206 amplifier in the RF transmitter employing FETs 235 for the RF signal amplification enables integration of the RF transmitter components into at main magnet assembly 280. Heatsinks of the transistors can be coupled to a cooling system of the main magnet assembly. Integration of the RF generating components near the excitation coil results in substantial reduction of the RF cable length. As result thereof the performance of the RF transmitter is improved.

FIG. 5 illustrates an allocation layout of the components of the RF transmitter 200. At least one of the following components can be configured for integration into the main magnet assembly: amplifiers 231-234, preamplifiers 221-224, combiner 261, and/or capacitor banks 258 and 256. In contrast, the RF ferrite chokes have to be configured for being positioned remotely from the main magnet assembly. For instance, the amplifiers, preamplifiers, capacitor banks can be located together with the main magnet assembly in a scanner room 291, while the DC power supply 259 and the RF ferrite chokes 255, 257 can be located in a technical room 290 remotely from the main magnet assembly.

FIG. 6 illustrates an allocation layout of the components of RF transmitter 200 with respect to a main magnet assembly 280, wherein the main magnet is a cylindrical magnet 280 with a bore 281 in it. Since the Amplifiers 231-234 are sources of heat they are homogeneously distributed over the main magnet assembly in order to homogenize a heat load of a cooling system of the main magnet assembly. On the other hand the amplifiers have to be preferably closely positioned to the main magnet in order to exploit cooling system of the main magnet for the cooling of the amplifiers and in order to reduce the length of the RF cables. On the other hand maximization of these benefits should not cause a decrease in a diameter of the bore 281. Thus the amplifiers have to be preferably allocated between the inner contour of the main magnet assembly 280 and the outer contour of the main magnet assembly 280, while the capacitor banks 256 and/or 258 be incorporated in the main magnet assembly in a similar way as amplifiers, or they be attached to the outer contour of the main magnet assembly.

FIG. 7 illustrates an allocation layout of the components of the RF transmitter 200 with respect to the main magnet assembly, wherein the main magnet is an open magnet. The assemblies of coils of the open magnet are depicted as 280 and 280'. The assemblies of coils are separated by an open space 281'. The same considerations for allocation of the components of the RF transmitter with respect to the main magnet assembly formulated above apply for this case as well. Thus the amplifiers 231 and 232 (233 and 234) have to be preferably allocated in the main magnet assembly 280 (280') at its left and right edges, while the capacitor banks 256 and/or 258 can be incorporated in the main magnet assemblies in a similar way as the amplifiers or they can be attached to the main magnet assemblies 280 and 280' to their left and right edges.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

In Summary, the following characteristic features can be recognized as distinctive and advantageous. The RF transmitter can be implemented using multiple digital feedback loops enabling monitoring and correction of the signal in multiple nodes of the RF transmitter. The digital feedback loops can enable generation of the RF excitation signal with advanced fidelity but allow compensation for deviation of the electrical properties of the components of the RF transmitter from their specifications as a result of manufacturing errors and/or degradation of the components during lifetime of a product. Components of the RF transmitter can be configured for incorporation in the main magnet assembly enabling further reduction of a footprint occupied by the MR system and/or improvement of fidelity of the RF excitation signal generated by the RF transmitter. Multiple RF power generation units operating in parallel can generate complex RF pulses, which generation by a single power generation unit constitutes an engineering challenge. Moreover the RF transmitter may remain operational when at least one of the RF power generation units is operational and at least one of the RF power generation units is out of order.

The invention claimed is:

1. A system for generation of a radio frequency, RF, excitation signal for excitation of nuclei via an RF excitation coil in a magnetic resonance, MR, system, the system comprising:
power generation units each comprising a synthesizer, an RF amplifier, and a first feedback loop unit adapted to include a sensor to register RF signal properties at the RF amplifier's output, compare the registered RF signal properties with target RF signal properties and configure the synthesizer to generate an RF signal which after amplification by the RF amplifier has a predefined first signal characteristic a combiner adapted for combining the RF signals amplified by the RF amplifiers for obtaining the RF excitation signal and the system comprising a second feedback loop unit adapted to include a sensor to register RF signal characteristics at the combiner's output, compare the registered signal characteristic with a target signal characteristic and control the synthesizers for providing the RF signals such that the RF excitation signal has a predefined second signal characteristic.

2. The system of claim 1, the system further comprising:
a memory storing machine-executable instructions;
a processor for controlling the system, wherein execution of the machine-executable instructions by the processor causes the system to:
receive a request to generate the specified RF excitation signal, split the specified RF excitation signal into signal components of the RF signal,
determine, for each of the power generation units, the respective predefined first signal characteristic representing one of the signal components, and
generate the specified RF signal using the first signal characteristics.

3. The system of claim 2, one of the signal components having higher peak amplitude than the other signal components.

4. The system of claim 2, one of the signal components being allocated in a different time-frequency domain as the other signal components.

5. The system of claim 2, the MR system being a magnetic resonance imaging system, the specified RF excitation signal comprising composite RF signal, wherein at least one of RF pulses of the composite RF signal is constructed out of fragments of the different signal components.

6. The system of claim 2, the system further comprising wherein execution of the machine-executable instructions by the processor causes the system to:
determine the predefined second signal characteristic to obtain the specified RF excitation signal.

7. The system of claim 2, each power generation unit further comprising:
a power supply of the RF amplifier and
a third feedback loop adapted to configure the power supply for supplying an electrical power to the RF amplifier with a predefined electrical power characteristic, wherein the determining, for each of the power generation units, of the respective predefined first signal characteristic comprises determining, for each of the power generation units, the respective predefined electrical power characteristic ensuring that the RF signal after the amplification has the respective first signal characteristic.

8. The system of claim 7, each RF amplifier comprising a field effect transistor, FET, configured for the amplification of the RF signal, the predefined electrical power characteristic comprises at least one of the following: voltage at a gate of the FET and current flowing through a channel of the FET.

9. The system of claim 8, the power supplies being switched power supplies each comprising a capacitor bank and a ferrite choke both being galvanically connected to a drain of the respective FET, the capacitor banks being configured for incorporation into a main magnet assembly of the MR system, the ferrite chokes being configured for being positioned remotely from the main magnet assembly of the MR system.

10. The system of claim 2, said predetermined signal characteristics comprising at least one of the following: average power, peak power, phase, spectrum, intermodulation, amplitude, and pulse shape.

11. The system of any of the preceding claims, the RF amplifiers and/or combiner being adapted for being incorporated in a main magnet assembly of the MR system.

12. A method for generating of a radio frequency, RF, excitation signal for excitation of nuclei via an RF excitation coil in a magnetic resonance, MR, system comprising:
power generation units each comprising an RF amplifier and
a combiner adapted for combining the RF signals amplified by the RF amplifiers for obtaining the RF excitation signal, the method comprising:
   receiving a request to generate the specified RF excitation signal,
   splitting the specified RF excitation signal into signal components of the specified RF excitation signal, and
   determining, for each of power generation units of the system, a respective predefined first signal characteristic representing one of the signal components, each of the power generation units further comprising a synthesizer and configuring by a first feedback loop unit the synthesizer to generate an RF signal which after amplification by the RF amplifier has the predefined first signal characteristic, combining the RF signals amplified by the RF amplifiers for obtaining the RF excitation signal and
   determining a second signal characteristic of the RF exciation signal and configuring by a second feedback loop the synthesizers such that the RF excitation signal has a target second signal characteristic.

13. A computer program product comprising machine-executable instructions for performing the method of claim 12.

14. A magnetic resonance, MR, system comprising:
a main magnet,
one or more radio frequency, RF, coils for excitation of nuclei in the MR system by an RF excitation signal,
an RF transmitter for generation of the RF excitation signal used for excitation of the nuclei via the one or more RF coils, the RF transmitter comprising:
   power generation units each comprising a synthesizer, an RF amplifier and a first feedback loop unit adapted to include a sensor to register RF signal properties at the RF amplifier's output, compare the registered RF signal properties with target RF signal properties and configure the synthesizer to generate an RF signal which after amplification by the RF amplifier has a predefined first signal characteristic and
   a combiner adapted for combining the RF signals amplified by the RF amplifiers for obtaining the RF excitation signal, and
the RF transmitter comprising a second feedback loop unit adapted to include a sensor to register RF signal characteristics at the combiner's output, compare the registered signal characteristic with a target signal characterisitic and control the synthesizers for providing the RF signals such that the RF excitation signal has a predefined second signal characteristic,
the MR system further comprising:
   a memory storing machine-executable instructions,
   a processor for controlling the MR system, wherein execution of the machine-executable instructions by the processor causes the MR system to:
   receive a specification of the RF excitation signal,
   split the specified RF excitation signal into signal components of the specified RF excitation signal,
   determine, for each of the power generation units, the respective predefined first signal characteristic representing one of the signal components, and
   generate by the RF transmitter the specified RF signal using the determined predefined first signal characteristics.

15. A magnetic resonance, MR, system as claimed in claim 14, wherein of the machine-executable instructions by the processor causes the MR system to determine the predefined second signal characteristic to obtain the specified RF excitation signal.

* * * * *